United States Patent [19]
Markle et al.

[11] Patent Number: 5,266,790
[45] Date of Patent: Nov. 30, 1993

[54] FOCUSING TECHNIQUE SUITABLE FOR USE WITH AN UNPATTERNED SPECULAR SUBSTRATE

[75] Inventors: David A. Markle, Saratoga; Gerald J. Alonzo; Hwan J. Jeong, both of Los Altos, all of Calif.

[73] Assignee: Ultratech Stepper, Inc., Santa Clara, Calif.

[21] Appl. No.: 993,547

[22] Filed: Dec. 21, 1992

[51] Int. Cl.$^5$ .............................................. G01J 1/20
[52] U.S. Cl. .................................. 250/201.2; 250/548
[58] Field of Search ...................... 250/548, 557, 201.2, 250/216, 201.6; 356/399, 400, 401, 357; 359/727

[56] References Cited

U.S. PATENT DOCUMENTS

| | | | |
|---|---|---|---|
| 4,964,705 | 10/1990 | Markle | 359/727 |
| 5,162,642 | 11/1992 | Akamatsu et al. | 250/201.6 |
| 5,216,235 | 6/1993 | Lin | 250/201.6 |

*Primary Examiner*—Edward P. Westin
*Assistant Examiner*—K. Shami
*Attorney, Agent, or Firm*—George J. Seligsohn

[57] ABSTRACT

A microlithographic stepper, employing a Half-Field Dyson projection optical system, achieves focusing of an image of a first-layer reticle pattern on a completely unpatterned reflective wafer surface by including a repetitive diffraction pattern on the reticle which has a configuration in which a particular ordinal diffraction order is normally missing. In response to being simultaneously illuminated with each of two incident monochromatic beams of light, diffraction orders generated by the repetitive diffraction pattern are imaged on the reflective wafer surface and then reflected back to and reimaged on the repetitive diffraction pattern on the reticle. Diffraction orders generated on the first encounter with the repetitive diffraction pattern generate light in the originally missing ordinal diffraction order on the second encounter. If more than one diffraction order from the first encounter contribute toward generating this missing-order light, then the light intensity of the originally missing order will depend on focus position of the wafer. Best focus will generate either maximum or minimum light intensity of the originally missing order. Using a single wavelength, a single repetitive diffraction pattern period, and a single incidence angle, provides a limited unambiguous focus range. However, by using a second wavelength, a second repetitive diffraction pattern period, or a second incidence angle, the unambiguous focus range is substantially extended. Each of these separate incident illuminating beams gives rise to its own set of reflected diffraction-order light. Thus, each of the two monochromatic beams of light gives rise to reflected diffraction-order light from each of two sets that occupy the position of the normally-missing particular ordinal diffraction order. Detection of interference maxima and minima in the intensity of this light, derived either by moving the wafer surface through in-focus or by electro-optic means responsive to this light being orthogonally polarized, permits best focus to be achieved.

40 Claims, 7 Drawing Sheets

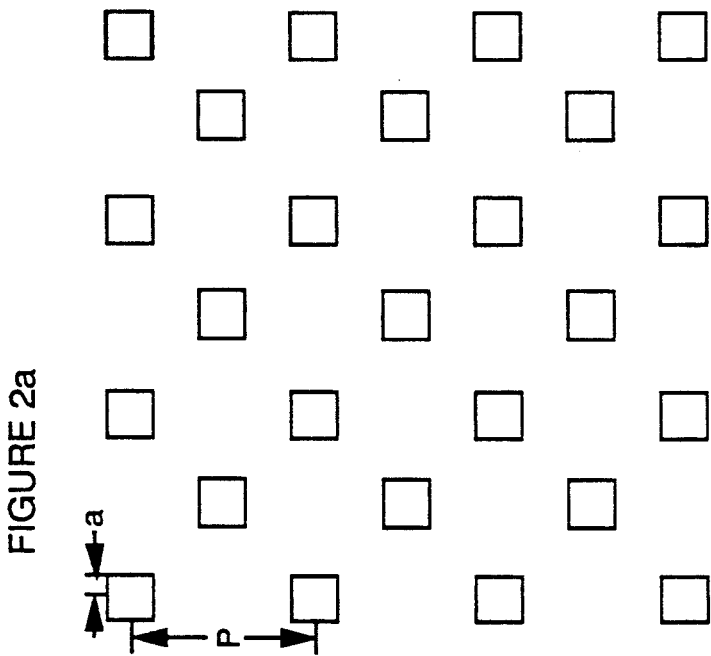
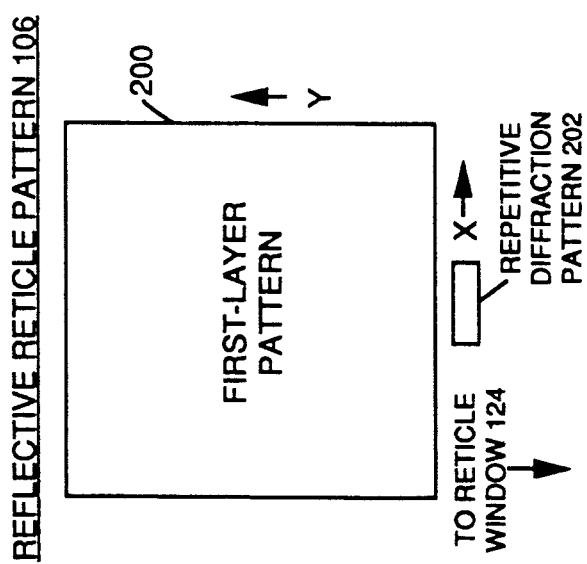
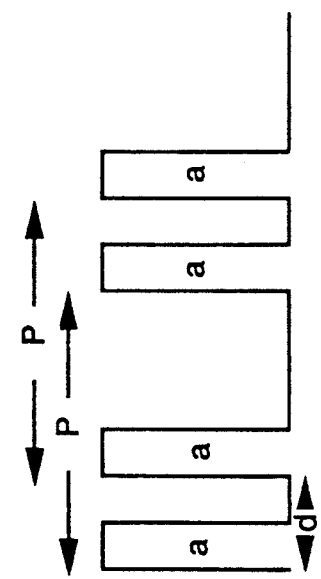

FOCUSING TECHNIQUE SUITABLE FOR USE WITH AN UNPATTERNED SPECULAR SUBSTRATE

CROSS-REFERENCE TO RELATED APPLICATIONS

The present application is related to the following copending applications filed concurrently with the present application and assigned to the same assignee as the present application: Ser. No. 07/994,239, entitled "Illumination System for Half-Field Dyson Stepper"; Ser. No. 07/993,795, entitled "An Alignment System for a Half-Field Dyson Projection System"; and Ser. No. 07/994,238, entitled "System for Achieving a Parallel Relationship between Surfaces of Wafer and Reticle of Half-Field Dyson Stepper".

BACKGROUND OF THE INVENTION

1. Field of the Invention

This invention relates to a focusing technique that may be used with any type of unpatterned specular substrate and, more particularly, relates to a focusing technique for a microlithographic stepper that employs a Half-Field Dyson projection optical system to achieve focus of an image of a reticle pattern on a completely unpatterned surface of a wafer.

2. Description of the Prior Art

In the fabrication of integrated circuits, a microlithographic stepper is used to image each of a stack of successive circuit-patterns on the surface of a silicon or GaAs wafer supported on a movable wafer stage of the stepper. The stepper, in response to control data applied thereto, is capable of precisely moving its wafer-supporting stage so as to bring each of the successively applied circuit-patterns of the stack into substantially perfect alignment with all the underlying circuit-patterns of the stack.

While it is possible to employ contact printing for imaging a circuit-pattern on the surface of the wafer, it is more practical to employ projection optical system for this purpose. One type of such projection optical system, now known as a Half-Field Dyson projection optical system, is disclosed in U.S. Pat. No. 4,964,705, entitled "Unit Magnification Optical System," which issued Oct. 23, 1990 to David A. Markle, and in its continuation-in-part U.S. Pat. No. 5,040,882, entitled "Unit Magnification Optical System with Improved Reflective Reticle," which issued Aug. 20, 1991 to David A. Markle (both of the aforesaid patents being assigned to the same assignee as the present patent application). The teachings of both of these patents are incorporated herein by reference. Specifically, an advantage of Half-Field Dyson projection optical system is that it is particularly suitable for projecting an image of a reflective reticle integrated-circuit layer pattern, that occupies a relatively large optical field, on the surface of a wafer.

The features of both a reticle integrated-circuit layer pattern and its image on a wafer surface have microscopic dimensions. This means that a high numerical aperture is required of any projection optical system, such as the Half-Field Dyson projection optical system, in order to obtain a high-resolution image of the integrated-circuit layer pattern on the wafer surface. Such a high numerical aperture projection optical system has a microscopic depth-of-focus. Further, the thickness of a wafer varies from one wafer to another. The problem is then to make sure that the surface of a wafer is controllably moved by the stepper to that position where the wafer's surface substantially coincides with the image plane of the projection optical system of the stepper. In the case of each of the stacked layer patterns above the first-layer pattern, the solution to this problem is relatively straight forward. Fiducial marks on an already-processed preceding layer pattern situated on the wafer's surface may be used in combination with a variety of different techniques to move the wafer's surface to that position at which these fiducial marks are in focus. However, this solution cannot be used to focus an unpatterned mirror-like wafer surface The present invention is directed to a focusing system that is capable of focusing such a first-layer pattern on a completely unpatterned mirror-like wafer surface, as well as focusing each subsequent-layer pattern on the wafer surface.

SUMMARY OF THE INVENTION

The present invention is directed to a technique for focusing a projection optical system on a reflective surface.

The technique comprises the illumination of at least one repetitive diffraction pattern located in the object plane of the projection optical system with a beam of radiation that includes a given wavelength to derive thereby a plurality of different diffraction orders which are imaged by the projection optical system onto the reflective surface. The repetitive diffraction pattern has a certain intended configuration such that substantially all radiation intensity is missing from a particular one of the plurality of diffraction orders. The technique further comprises employing the projection optical system to reimage at least two given imaged diffraction orders reflected from the reflective surface back onto the repetitive diffraction pattern in the object plane to derive thereby diffraction orders located in the position normally occupied by the particular missing one of the plurality of diffraction orders.

Interference between the diffracted radiation of the given wavelength of the two reimaged diffraction orders located in the position normally occupied by the particular missing one of the plurality of diffraction orders causes the radiation intensity thereof to vary sinusoidally in accordance with the amount of focus error of the projection optical system in focusing on the reflective surface, and a maxima or a minima in the radiation intensity of the reimaged two given ones of said imaged diffraction orders is indicative of the quantitative value of the focus error.

The focusing technique of the present invention is particularly suitable for use with the projection optical system of a microlithographic stepper, such as a Half-Field Dyson projection optical system, for moving an unpatterned reflective surface of a wafer into substantial coincidence with the image plane of the projection optical system of the stepper.

BRIEF DESCRIPTION OF THE DRAWING

FIG. 1b illustrates 3-dimensional Cartesian coordinates used to reference the orientation of the sectional view of the Half-Field Dyson microlithographic stepper projection optical system shown in FIGS. 1 and 1a;

FIG. 2 diagrammatically illustrates a reflective reticle pattern that includes a repetitive diffraction pattern which is employed by the focusing system of the present invention;

FIGS. 2a, 2b and 2c, respectively diagrammatically illustrate three different examples of repetitive-diffraction-pattern configurations that may be employed by the repetitive diffraction pattern of FIG. 2;

DESCRIPTION OF THE PREFERRED EMBODIMENTS

Figure 1:
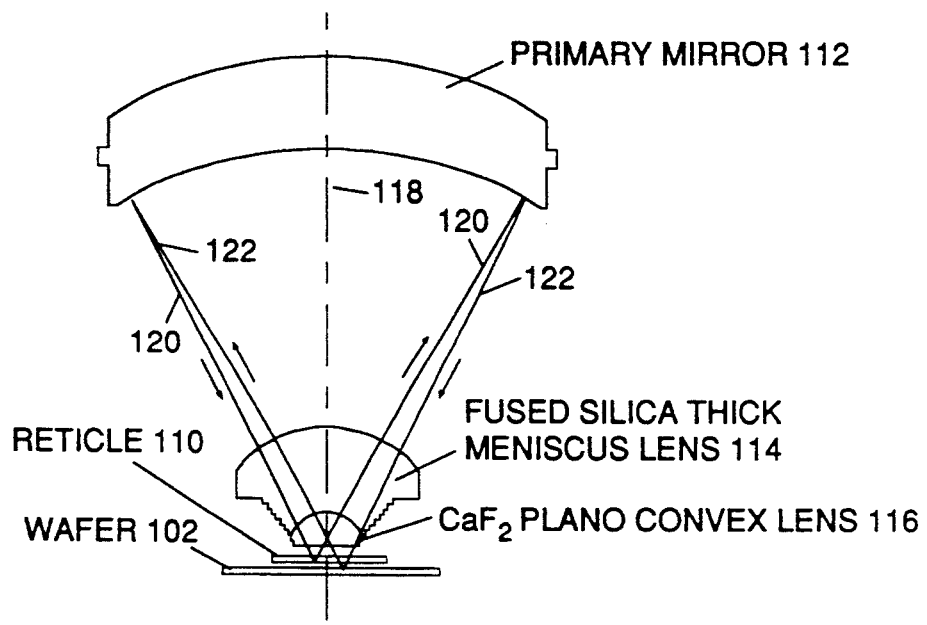
FIGS. 1 and 1a schematically illustrate prior-art structure of a Half-Field Dyson microlithographic stepper projection optical system similar to that disclosed in the aforesaid Markle patents.
Figure 1B:
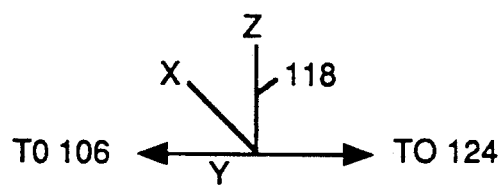
Figure 1A:
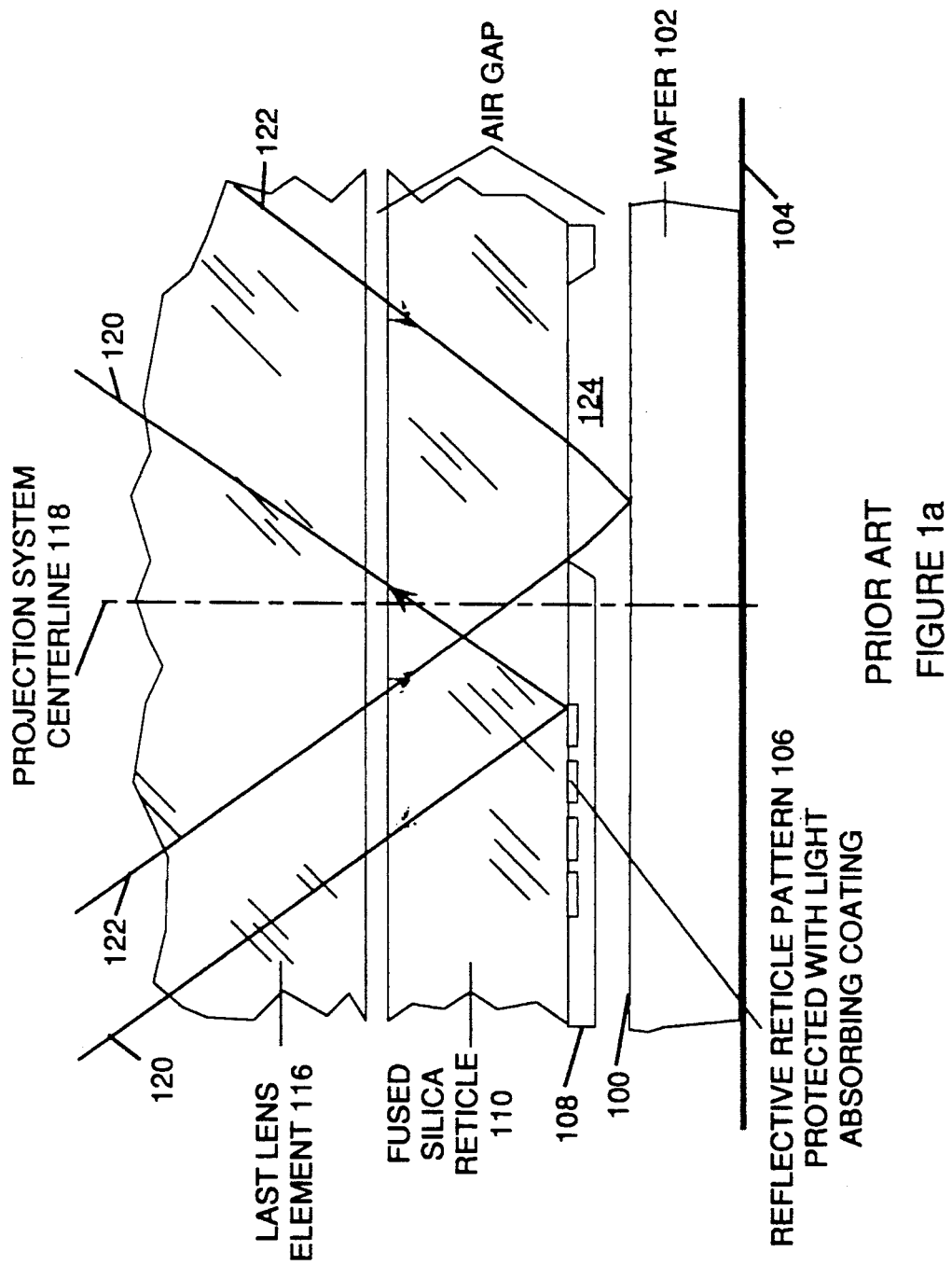
Figure 3:
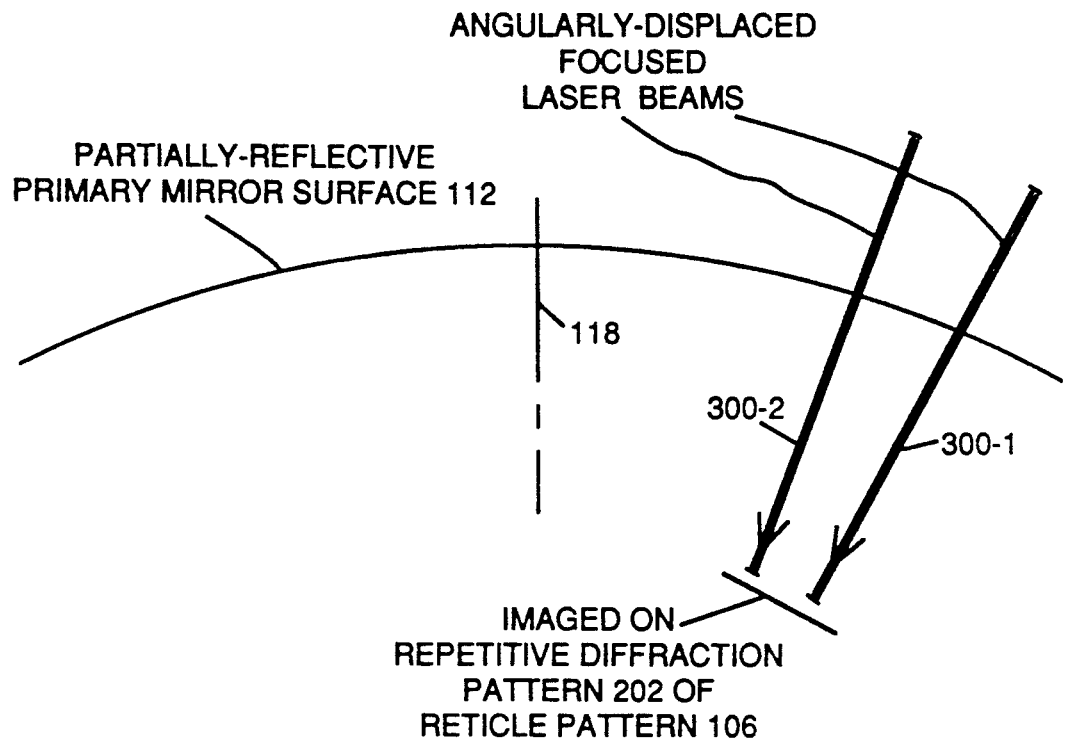
FIGS. 3 and 3a illustrate the spatial arrangement, with respect to the primary mirror of the Half-Field Dyson microlithographic stepper projection optical system shown in FIG. 1, of first and second beams of light that are imaged on the reflective reticle pattern of FIG. 2.

Referring to FIGS. 1 and 1a, there is shown the structure of the Half-Field Dyson projection optical system, as currently designed, of a microlithographic stepper. As shown, upper surface 100 of wafer 102 (which wafer is supported by movable wafer-stage 104 of the microlithographic stepper) is situated slightly below (i.e., about 0.15 mm below) reflective reticle pattern 106. Reflective reticle pattern 106, which is backed with a protective light-absorbing coating 108, is situated on the underside of fused silica reticle 110. The Half-Field Dyson projection optical system comprises concave primary spherical mirror 112, fused silica thick meniscus lens 114 and $CaF_2$ plano convex lens 116, all of which are symmetrically disposed about optic axis 118. Primary mirror 112, which is partially reflective and partially transmissive, permits focused illuminating light (asymmetrically disposed slightly off of optic axis 118, as shown in FIG. 3 of the aforesaid U.S. Pat. No. 4,964,705) from a light source situated on the other side of primary mirror 112 to be transmitted through primary mirror 112 and imaged on reflective reticle pattern 106. The reticle 110 is situated so that light rays 120 reflected from reflective reticle pattern 106, which lies in an object plane of the projection optical system will reflect from primary mirror 112 as light rays 122 that, after traveling through reticle window 124 in reticle 110, are imaged in an image plane of the projection optical system situated below its object plane.

The Half-Field Dyson projection optical system, as currently designed, is a 1 to 1 magnification system, that employs a 600 millimeter separation between primary mirror 112 and its predetermined image plane and can provide a 20×40 mm field size even with a numerical aperture as high as 0.7. Such a Half-Field Dyson system, operating at a deep ultra-violet wavelength (e.g., 248 nm derived from either a mercury lamp or a KrF excimer laser) would easily resolve a feature of reflective reticle pattern 106 having dimensions as small as 0.25 μm in size.

The thickness of wafers varies from one wafer to another. In order that an in-focus image of reflective reticle pattern 106 be imaged on upper wafer surface 100, it is essential that the position of wafer 102, supported by movable wafer-stage 104, be moved with extremely high precision so that its upper surface 100 is, at least, within the very small (i.e., about 0.50 μm) depth of focus of the above-described Half-Field Dyson projection optical system. This requires a focusing system for determining whether or not an in-focus image of reflective reticle pattern 106 is, in fact, imaged on upper wafer surface 100, and, if not, deriving control data for moving wafer-stage 104 to that position at which wafer surface 100 is substantially coincident with the image of reflective reticle pattern 106.

By definition, there are no fiducial marks of any kind on upper surface 100 of a completely unpatterned wafer 102 that can be used by a focusing system to position upper wafer surface 100 so that an in-focus image of a first-layer reflective reticle pattern 106 is achieved. However, upper surface 100 of a completely unpatterned wafer 102 is reflective and operates as a mirror. Further, the imaging capability of the above-described Half-Field Dyson projection optical system is reciprocal, so that the reflection of the image of reflective reticle pattern 106 from upper surface 100 of a completely unpatterned wafer 102 will be imaged back on reflective reticle pattern 106 itself on reticle 110. The focusing system of the present invention takes advantage of this reciprocal imaging capability of the above-described Half-Field Dyson projection optical system to achieve an in-focus image of a first-layer reflective reticle pattern 106 on upper surface 100 of a completely unpatterned wafer 102.

Referring to the 3-dimensional Cartesian coordinates shown in FIG. 1b, it is apparent that the sectional views of the Half-Field Dyson microlithographic stepper projection optical system shown in FIGS. 1 and 1a lie in a vertical Y-Z plane oriented parallel to the plane of the paper, with the Z coordinate corresponding to the vertical optic axis 118, so that the X coordinate is oriented perpendicular to the plane of the paper. In this view, the Y coordinate lies horizontally in the vertical Y-Z plane, with reticle pattern 106 being situated to the left and reticle window 124 being situated to the right of the optic axis 118 Z coordinate.

As shown in FIG. 2, reflective reticle pattern 106 on reticle 110 comprises both the desired first-layer pattern 200 itself, and repetitive diffraction pattern 202 that comprises one or more sets of repetitive diffraction patterns employed for focusing purposes. Preferably, the X and Y coordinates of first-layer pattern 200 and repetitive diffraction pattern 202 are oriented on reticle 110 as shown, with the Y coordinate being oriented in a direction away from reticle window 124, and repetitive diffraction pattern 202 being situated closer to reticle window 124 in a position within a scribe line through which a completely fabricated integrated-circuit wafer is sawed into a plurality of individual integrated-circuits (thereby destroying any repetitive diffraction patterns so they are not present in the completely fabricated wafer). In the FIG. 2 view, the X-Y plane is the plane of the paper.

FIGS. 2a, 2b and 2c illustrate three different examples of repetitive diffraction-pattern configurations, in their ideal forms, that may be employed by repetitive diffraction pattern 202.

FIG. 2a discloses the transmission profile across a simple linear-grating configuration having an idealized period P, which comprises equidistant grating lines, each of which has an idealized width a=P/2. As known from physical optics of Fraunhofer diffraction, whenever the ratio of P/a of a simple linear-grating configuration is an integer, the positive and negative diffraction orders corresponding to a particular integer will be missing. Thus, in the case of the simple linear-grating configuration shown in FIG. 2a, where P/a=2, both the −2 and +2 diffraction orders will be missing.

FIG. 2b discloses the transmission profile across a more complex linear-repetitive-pattern configuration made up of two simple linear-grating configurations, each having an idealized period P and spaced from one another by a distance d=P/4. The width of each of the equidistant grating lines of each of the two simple linear-grating configurations is a. As is also known from physical optics of Fraunhofer diffraction, in the case of a linear-grating configuration made up of two spaced linear-grating configurations, when $$d = \frac{m + 1/2}{n} \cdot P,$$

where m is a given integer (including 0), the positive and negative of the nth ordinal order will be missing. Thus, in the case of the complex linear-grating configuration shown in FIG. 2b, where d=P/4, both the −2 and +2 diffraction orders will be missing (assuming that m has its least possible value-that is, assuming m=0).

FIG. 2c discloses a two-dimensional, checkerboard-grating configuration having an idealized period P in each dimension, which comprises spaced square grating elements, each of which has idealized sides a=P/2. Similar to the case of the simple linear-grating configuration shown in FIG. 2a, where P/a=2, both the −2 and +2 diffraction orders will be missing in each of the two dimensions of the checkerboard-grating configuration shown in FIG. 2c.

If the respective ideal values of a, P and d of repetitive diffraction pattern 202 could be achieved in practice, there would be no difference in performance among the respective grating configurations of FIGS. 2a, 2b and 2c. However, the size of each of a, P and d is so small that it is not possible to maintain the exact tolerances in the fabrication of these grating configurations needed to substantially meet these ideal values. For instance, in the case of the FIGS. 2a and 2c grating configurations, the ideal value of P may be only 3.6 μm, so that, in this case, the ideal value of a is only about 1.8 μm, while, in the case of the FIGS. 2b grating configuration, the ideal value of P may be only 6.0 μm, so that, in this case, the ideal value of d is only about 1.5 μm.

For reasons to be discussed below, it is important that residual 2nd diffraction order light, due to error in the actual values of a, P and d from their ideal values, be as small as possible. In the case of the simple grating configuration of FIG. 2a, a given error in the grating line width a results in a relatively large amount of residual 2nd diffraction order light, since e-beam machines, used to fabricate the reflective diffraction elements of repetitive diffraction pattern 202 on reticle 110, do a good job of line placement (i.e. the period P remains substantially constant) and not such a good job of linewidth control (i.e. the linewidth a tends to vary from reticle-to-reticle). However, In the case of the more complex grating configuration of FIG. 2b, the linewidth a is relatively unimportant. This means that the grating configuration of FIG. 2b is to be preferred, since tolerance errors in its practical fabrication result in less undesired residual 2nd diffraction order light being produced than is produced by such tolerance errors in the FIG. 2a grating configuration. The checkerboard configuration of the FIG. 2c grating configuration also can be fabricated to produce less undesired residual 2nd diffraction order light than is produced by the FIG. 2a grating configuration because of its two-dimensional nature.

Returning to FIG. 2, it is assumed, for illustrative purposes, that repetitive diffraction pattern 202 is a linear grating comprising the FIG. 2b grating configuration. In this case, repetitive diffraction pattern 202 may comprise 12 pairs of reflective grating line elements spaced along the horizontal X axis, with the length of each grating line element being oriented parallel to the vertical Y axis. The length of each grating line element may be substantially 80 μm and its nominal width may be 0.7 μm. With a period P of substantially 6.0 μm, the 12 pairs of grating line elements occupy a distance of substantially 68.2 μm along the X axis.

Figure 3A:
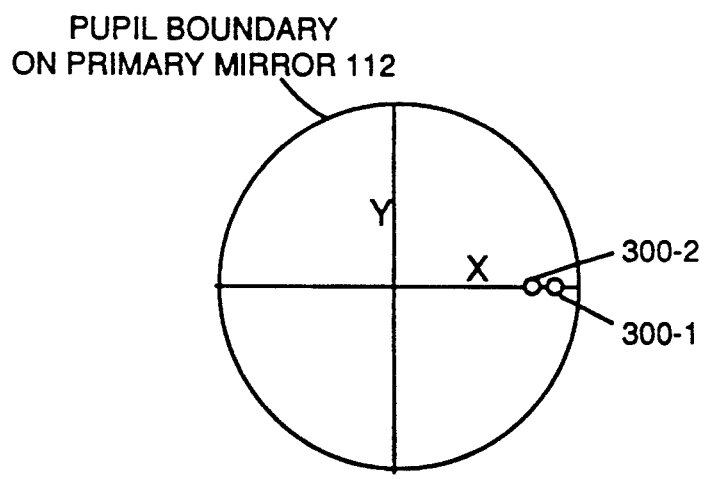

Referring now to FIGS. 3 and 3a, two angularly-displaced focused laser beams 300-1 and 300-2 (from a source not shown that is situated beyond primary mirror 112) are transmitted through partially transmissive primary mirror 112 and imaged on at least the portion of the reticle pattern 106 of FIG. 2 which includes repetitive diffraction pattern 202. More particularly, the source of the focused laser beams, by way of example, may comprise a single solid-state laser generating monochromatic light having a wavelength of 780 nm, a beam splitter for splitting the laser output light into beams 300-1 and 300-2, and optical system means for focusing each of these two beams. As indicated, each of beams 300-1 and 300-2 is a narrow beam. Specifically, each of beams 300-1 and 300-2 may have a small numerical aperture of only about 0.01, corresponding to about a 4 mm diameter spot size at primary mirror 112. Further, as shown in FIGS. 3 and 3a, beams 300-1 and 300-2, at primary mirror 112, are disposed on the X axis of primary mirror 112 near the right edge thereof.

Figure 4:
FIG. 4 illustrates the respective angles of incidence of each of the first and second beams of light imaged on the reflective reticle pattern of FIG. 2 and the respective angles of reflection therefrom.

As shown diagrammatically in FIG. 4, angularly-displaced beams 300-1 and 300-2 of FIGS. 3 and 3a are incident on reflective reticle pattern 106 at angles of incidence $\phi_1$ and $\phi_2$, respectively, giving rise to angularly-displaced reflected beams 400-1 and 400-2 at angles of reflection $\phi_1$ and $\phi_2$, respectively. In the case of that portion of the reticle pattern 106 of FIG. 2 which includes repetitive diffraction pattern 202, each of angularly-displaced reflected beams 400-1 and 400-2 corresponds to the 0 diffraction order for that reflected beam.

For simplicity in teaching the principles of the present invention, it is temporarily assumed that (1) that the reflective grating pattern of repetitive diffraction pattern 202 comprises a single repetitive diffraction configuration set having the ideal parameters discussed above in connection with FIG. 2b, and (2) that only diffraction of the light of beam 300-1 incident on this single repetitive diffraction configuration set of repetitive diffraction pattern 202 need be considered.

Figure 4B:
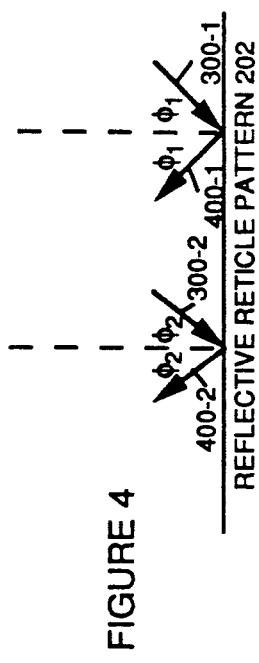
FIGS. 4a, 4b, 4c, 4d and 4e, respectively, illustrate an example of (1) the outgoing diffraction orders reflected from the reticle grating pattern, (2) the incoming diffraction orders to the wafer surface, (3) the reflected diffraction orders from the wafer surface incoming to the grating pattern, (4) the pertinent outgoing diffraction orders derived from incoming +1 diffraction order, and (5) the pertinent outgoing diffraction orders derived from incoming −1 diffraction order.
Figure 4A:

FIG. 4a diagrammatically shows with solid lines the respective directions of all outgoing diffraction-order light reflected from the grating pattern, with the angular direction of diffraction order 0 corresponding to that of reflected beam 400-1 of FIG. 4. The outgoing diffraction-order light also includes the $-3, -1, +1, +3, +4, +5, +6, +7, +8, +9, +10$ and $+11$ diffraction-order light. In addition, FIG. 4a shows with dashed lines the respective directions which would be occupied by the missing 2nd diffraction order if it were present. Because the intersection of beam 301 with primary mirror 112 is near the right edge thereof (see FIGS. 3 and 3a), the $\phi_1$ values of the angle of incidence of beam 300-1 and the angle of reflection of beam 400-1 are relatively large. The result is that, in the diffraction-order example shown in FIG. 4a, ordinal negative diffraction orders beyond $-3$ are not produced, and (2) the outgoing $-3$, $+10$ and $+11$ diffraction-orders are angularly directed beyond the edge of primary mirror 112, and are, therefore, not reflected from primary mirror 112 back to the completely unpatterned reflective upper surface 100 of wafer 102. Thus, as shown in FIG. 4b, the diffraction-order light (reflected from primary mirror 112) incoming to and imaged on the completely unpatterned reflective surface 100 of wafer 102 consists of only $-1, 0, +1, +3, +4, +5, +6 +7, +8$ and $+9$ diffraction-order light (the $+2$ diffraction order being missing).

Figure 4C:
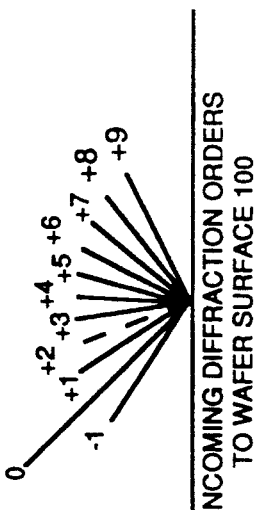

Because of the reciprocal nature of the projection optical system, the $-1, 0, +1, +3, +4, +5, +6 +7, +8$ and $+9$ diffraction-order light imaged on surface 100 of wafer 102 is reflected (in mirror image form) back to primary mirror 112 and then further reflected back as incoming diffraction-order light to the reflective grating pattern on reticle 110, as shown in FIG. 4c. Each of the $+9, +8, +7, +6, +5, +4, +3, +1, 0$ and $-1$ incoming diffraction-orders to the reflective grating pattern on reticle 110 constitutes a separate beam of incident illuminating light giving rise to its own individual set of additional diffraction orders reflected (in mirror image form) from the reflective grating pattern on reticle 110.

Figure 4D:
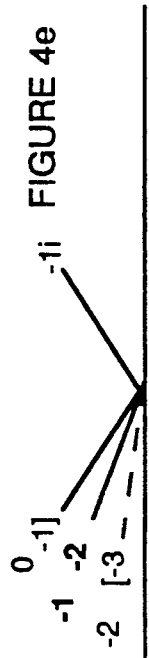

FIG. 4d shows selected outgoing additional diffraction-order light derived from the separate $+1$ FIG. 4c diffraction-order beam of incoming illuminating light (designated $+1i$ in FIG. 4d). As indicated in FIG. 4d, the outgoing additional $-4, -3$, (missing) $-2, -1$, and 0 diffraction-orders derived from the incoming $+1i$ diffraction-order beam of illuminating light corresponds in angular position to that of the original (shown in FIG. 4a) outgoing $-3, -2, -1, 0$ and $+1$ diffraction orders (shown in brackets in FIG. 4d), where the outgoing $-3$ diffraction-order light derived from the incoming $+1i$ diffraction-order beam of illuminating light corresponds in angular position to that which would have been occupied by the originally-missing $-2$ diffraction order (shown in FIG. 4a). Therefore, because of the above-described double-diffraction process, there is now some light present in the angular position of the originally-missing $-2$ diffraction order, where otherwise there would be no light.

Figure 4E:
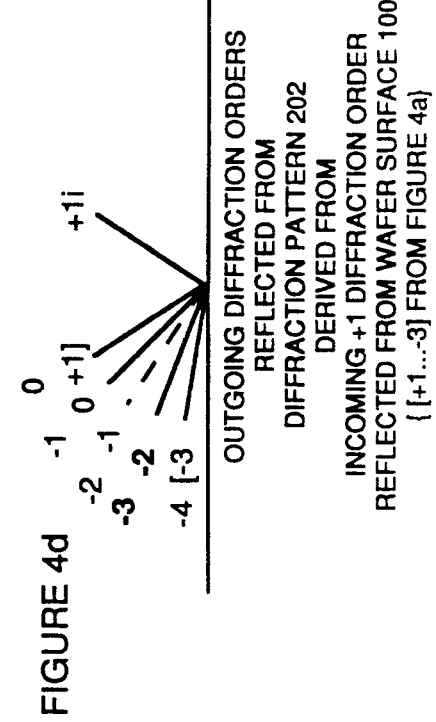

FIG. 4e shows selected outgoing additional diffraction-order light derived from the separate $-1$ diffraction-order (of FIG. 4c) beam of incoming illuminating light (designated $-1i$ in FIG. 4e). As indicated in FIG. 4e, the outgoing additional (missing) $-2, -1$, and 0 diffraction-order light derived from the incoming $-1i$ diffraction-order beam of illuminating light corresponds in angular position to that of the original (shown in FIG. 4a) outgoing $-1, -2$ and 0 diffraction order light (shown in brackets in FIG. 4e), where the outgoing $-1$ diffraction-order light derived from the incoming $-1i$ diffraction-order beam of illuminating light corresponds in angular position to that which would have been occupied by the originally-missing $-2$ diffraction order (shown in FIG. 4a). Therefore, in FIGS. 4d and 4e, because of the above-described double-diffraction process, there are at least two ways of filling in the angular position of the originally-missing $-2$ diffraction order.

The same process discussed above in connection with diffraction-order light derived from illuminating light of beam 300-1 (FIG. 4), applies with equal force to diffraction-order light derived from illuminating light of beam 300-2 (FIG. 4). However, due to the difference in the values of $\phi_1$ and $\phi_2$, the respective angular positions of the originally-missing $-2$ diffraction order light derived from respective illuminating light of beams 300-1 and 300-2 will be different from one another.

From the foregoing discussion, it is apparent that the originally missing $-2$ diffraction-order light derived from illuminating light of beam 300-1 comprises the sum of first and second components (i.e., the separate FIGS. 4d and 4e components of beam 300-1) of monochromatic light of a given wavelength (e.g., 780 nm) that, after originally illuminating reflective repetitive diffraction pattern 202 on reticle 110, have traveled over different paths from repetitive diffraction pattern 202 to primary mirror 112, then from primary mirror 112 to the reflective surface 100 of wafer 102, then back from surface 100 to primary mirror 112, then back from primary mirror 112 to reflective repetitive diffraction pattern 202, and finally reflected back from repetitive diffraction pattern 202 as a component of the aforesaid $-2$ diffraction-order light derived from the illuminating light of beam 300-1. While the wavelength of each of these first and second components is the same, the round-trip path lengths between the first and second diffraction from the repetitive diffraction pattern will be different from one another if wafer surface 100 is not in perfect focus. Therefore, the $-2$ diffraction-order light of each of these first and second components will interfere with one another, resulting in the intensity of the $-2$ diffraction-order light of the sum of these first and second components being determined by the difference in path length traveled by each of them (i.e., the phase difference between them). Further, vertical movement up or down of wafer-supporting stage 104 by the microlithographic stepper causes this phase difference to vary continuously. Each change over a range of one wavelength in the difference in path length traveled by each of the first and second components of the originally-missing $-2$ diffraction-order light derived from illuminating light of beam 300-1, thereby resulting in the intensity of the sum of these first and second components thereof varying sinusoidally from maxima to minima back to maxima in accordance with the vertical position of wafer 102 on stage 104.

In a similar manner, vertical movement up or down of wafer-supporting stage 104 by the microlithographic stepper causes the phase difference between third and fourth components of the originally-missing $-2$ diffraction-order light derived from beam 300-2 (which correspond to the first and second components of the originally-missing −2 diffraction-order light derived from beam 300-1) to vary continuously with each change over a range of one wavelength in the difference in path length traveled by each of these third and fourth components, thereby resulting in the intensity of the sum of these third and fourth components thereof varying sinusoidally from maxima to minima back to maxima in accordance with the vertical (Z) position of wafer 102 on stage 104. However, while a vertical position of wafer 102 on stage 104 at which maxima or minima of the sum of the third and fourth components occur, in general, will not coincide with a vertical position of wafer 102 on stage 104 at which maxima or minima of the sum of the first and second components occur, these vertical positions will substantially coincide when the upper surface 100 of wafer 102 is positioned to substantially coincide with the image plane of the Half-Field Dyson projection optical system (i.e., the image of reticle pattern 106 is in focus at this position). The focusing system of the present invention takes advantage of this fact.

Figure 5:
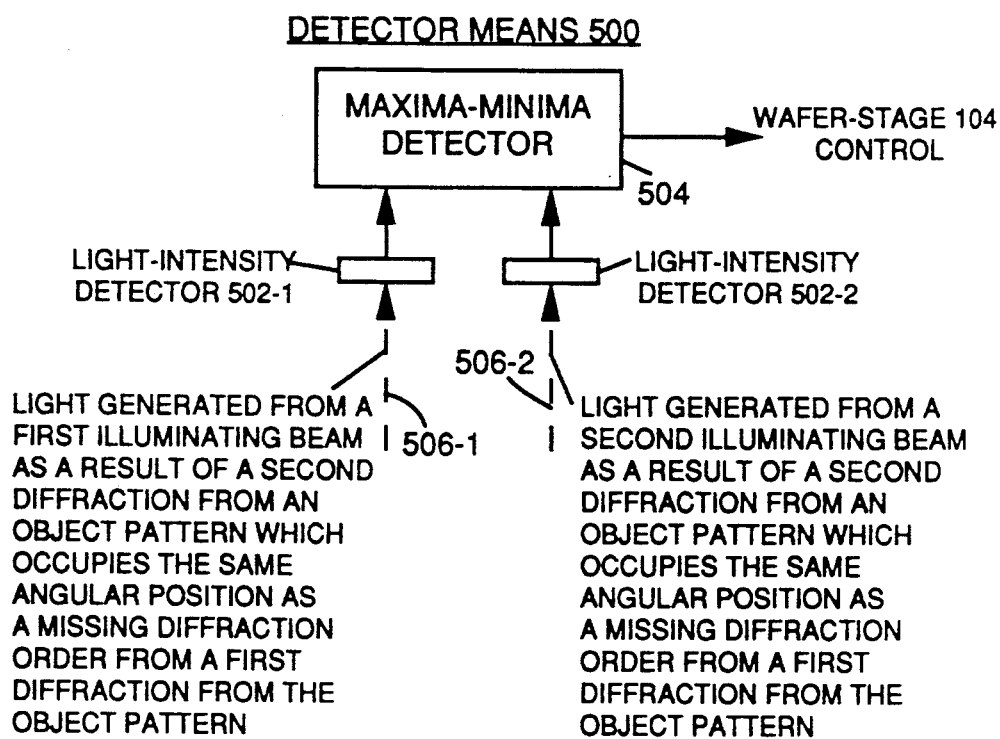
FIG. 5 schematically illustrates a detector means responsive to the respective intensities of received light derived from the first light beam in the spatial position of its −2 diffraction order and received light derived from the second light beam in the spatial position of its −2 diffraction order.

More specifically, detector means 500, shown schematically in FIG. 5, includes light-intensity detector 502-1, light-intensity detector 502-2 and maxima-minima detector 504. In practice, −2 diffraction-order light 506-1 generated from beam 300-1 is focused on light-intensity detector 502-1 and −2 diffraction-order light 506-2 generated from beam 300-2 is focused on light-intensity detector 502-2 by a suitable optical system, not shown. Light-intensity detector 502-1 derives an output indicative of the then-existing light intensity of the −2 diffraction-order light derived from beam 300-1, which is applied as a first input to maxima-minima detector 504, and light-intensity detector 502-2 derives an output indicative of the then-existing light intensity of the −2 diffraction-order light derived from beam 300-2, which is applied as a second input to maxima-minima detector 504. Maxima-minima detector 504 may include separate means for determining whether or not each of maxima-minima detector 504's inputs passes through either a maxima or a minima (while wafer-stage 104 is being moved vertically up or down). Each of these separate means may comprise means for detecting each zero-crossover of its differentiated input. Further, maxima-minima detector 504 may comprise synchronous detection means for deriving a wafer-stage 104 control output from maxima-minima detector 504 only when both of its separate means concurrently determine that its input is passing through either a maxima or a minima. In response to maxima-minima detector 504 deriving such a wafer-stage 104 control output, indicative of upper surface 100 of wafer 102 now being positioned to substantially coincide with the image plane of the Half-Field Dyson projection optical system, wafer stage 104 is held in this position during exposure.

It is apparent from the foregoing description that the use of two illuminating beams (e.g. beams 300-1 and 300-2) substantially extends the range of limited unambiguity, with respect to that of only a single illuminating beam (e.g. beam 300-1), in determining when the position of wafer surface 100 substantially coincides with the image plane of the projection optical system of the stepper. This range of limited unambiguity may be further extended by the use of three or more illuminating beams.

In order to obtain interference modulation in the missing order position, it is necessary to have at least two contributors. More than two contributors result in a more complex modulation signal which is more difficult to interpret. Good control of the number of possible contributors is achieved by choosing a pattern period that diffracts the minimum necessary orders within the angular space covered by the optical system.

It has been assumed up to now that the repetitive diffraction configuration is ideal, so that all light of both the +2 and −2 diffraction orders will be originally missing. However, as discussed above, such an ideal grating configuration is unattainable in practice. Thus, in practice, the desired −2 diffraction-order light that varies in intensity with changes in the position of wafer-stage 104, which is employed by the focusing system of the present invention, constitutes only a modulation component of all the light present in the original −2 diffraction-order. The relative light intensity of this desired modulation component, which can be small compared to the undesired residual light, makes it preferable to employ repetitive diffraction configurations, such as those shown in FIGS. 2b and 2c, which are more easily fabricated to produce less undesired residual light than that produced by a simple linear grating, such as that shown in FIG. 2a.

The above-discussed teaching of one preferred embodiment of the focusing system of the present invention assumes that upper surface 100 is oriented precisely parallel to reticle pattern 106 of reticle 110. In practice, the teachings disclosed in the aforesaid cross-referenced co-pending patent application Ser. No. 07/994,238, entitled "System for Achieving a Parallel Relationship between Wafer Surface and Reticle of Half-Field Dyson Stepper", may be employed to substantially achieve such precise parallel orientation.

The focusing system of the present invention is not limited to microlithographic-stepper embodiments that employ a Half-Field Dyson projection optical system that makes use of a reflective repetitive diffraction pattern The focusing system of the present invention may be used to advantage with a microlithographic-stepper employing any type of projection optical system capable of reciprocal imaging of either a reflective or transmissive reticle repetitive diffraction pattern on the reflective surface of a wafer and reimaging of the image of the reticle repetitive diffraction pattern from the reflective surface of the wafer back to the reticle repetitive diffraction pattern. In fact, the technique of the present invention is useful in positioning a surface of any type of unpatterned specular substrate substantially in the image plane of a projection optical system.

Although the embodiment of the present invention discussed above in connection with FIG. 1 through FIG. 5 is simple and possesses many advantages, it also possesses some minor disadvantages. Specifically, in this embodiment, it is necessary to mechanically move the relative positions of the wafer and reticle with respect to one another in order to detect maxima or minima in the intensity of the two interfering reimaged diffraction orders located in the position normally occupied by the particular missing diffraction order. Such maxima and minima in intensity result because the intensity of the two interfering reimaged diffraction orders varies as a sinusoidal function of the amount of focus error in the position of the wafer in response to changes in the difference between the path lengths of the two orders as the relative positions of the wafer and reticle are mechanically moved with respect to one another.

Measuring the phase of the interference signal would determine the wafer focus error. However, because a light detector can only measure signal intensity directly, rather than the phase of the signal, it is necessary to scan the wafer or reticle through a range of focus positions. By fitting an ideal sinusoidal curve to the intensities measured at various focus positions, it is possible to accurately deduce the position of best focus. Focus scanning can be achieved by moving either the reticle or wafer back and forth through the focus direction. But, this kind of mechanical scanning is time consuming, often generates vibration and is counterproductive during the exposure period which is the most critical period of time for focusing These problems in the above-discussed embodiment are overcome by employing electro-optical scanning, rather than mechanical scanning, the principles of which are exemplified in the alternative embodiment of the present invention shown in FIG. 6.

Figure 6:
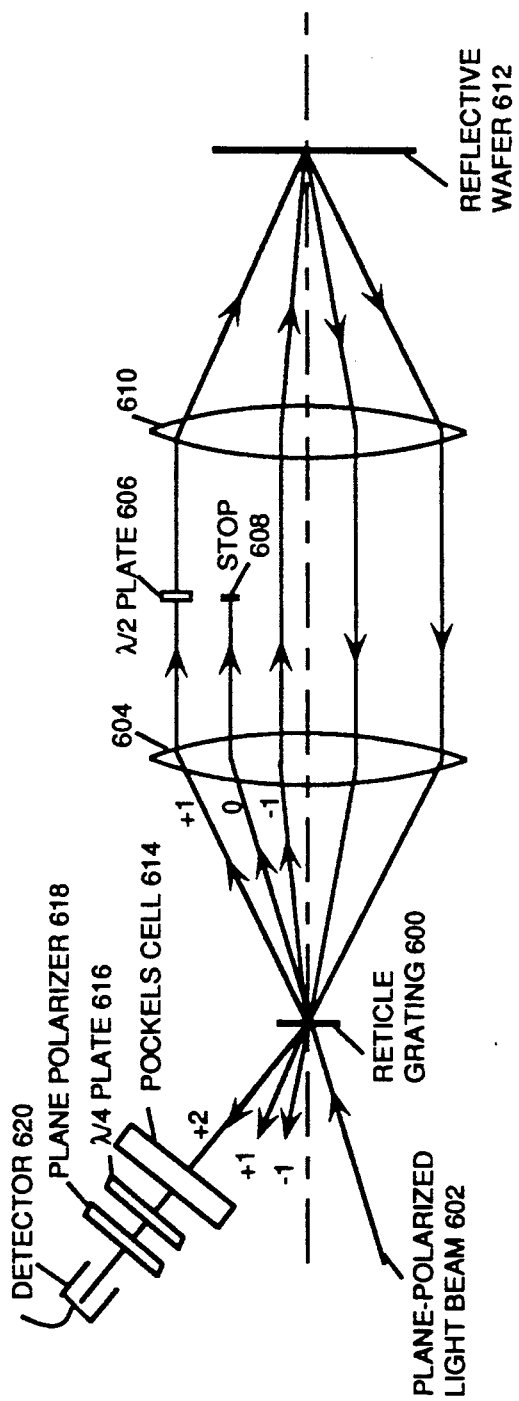
FIG. 6 schematically illustrates the principles of an alternative embodiment of the present invention which makes use of polarized illuminating light, and includes electro-optic means for generating a signal having a quantitative value indicative of the amount of focus error.

As shown in FIG. 6, reticle grating 600, has focused thereon (by a part of a projection optical system) a narrow plane-polarized monochromatic light beam 602, which is incident thereon at an oblique angle with respect thereto. This results in reticle grating 600 deriving a plurality of plane-polarized diffraction orders, of which only the +1, 0 and −1 plane-polarized diffraction orders are shown in FIG. 6. However, in accordance with the above-described principles of the present invention, grating 600 is designed to have a certain configuration that results in substantially all energy to be missing from a particular one of the plurality of diffraction orders (assumed to be the +2 order) The +1, 0 and −1 plane-polarized diffraction orders emerging from grating 600 are passed through lens 604 (forming a part of the projection optical system) Solely for illustrative purposes in describing the alternative embodiment of the present invention shown in FIG. 6, it will be assumed that plane-polarized light beam 602 and each of the +1, 0 and −1 plane-polarized diffraction orders are all polarized in the vertical plane.

Half-wave ($\lambda/2$) plate 606, disposed substantially at the pupil of lens 604 in the path of only the +1 diffraction order and spatially oriented substantially at a 45° angle with respect to its original vertical plane of polarization, has the effect of rotating its original vertical plane of polarization by 90°. Therefore, the +1 diffraction order, upon emerging from $\lambda/2$ plate 606, exhibits a horizontal plane of polarization. However, the 0 and −1 diffraction orders still retain their vertical plane of polarization. Stop 608, disposed in the path of the 0 diffraction order, filters out the 0 diffraction order. In a similar manner, all unshown diffraction orders higher than the +1 and −1 orders are also filtered out. Therefore, only the horizontally polarized +1 and the vertically polarized −1 (i.e., orthogonally polarized) diffraction orders are left for further consideration. As known in the art, orthogonally polarized waves can be treated separately and independently of one another.

Lens 610 (forming a part of the projection optical system) images each of the orthogonally polarized +1 and −1 diffraction orders on the reflective surface of wafer 612. The reflected orthogonally polarized +1 and −1 diffraction orders, after passing back through lenses 610 and 606 are reimaged on grating 600, giving rise in the position normally occupied by the missing +2 diffraction order to diffracted reimaged light derived from the +1 diffraction order and also to diffracted reimaged light derived from the −1 diffraction order. However, because the +1 and −1 diffraction orders are orthogonally polarized with respect to one another, the two orthogonal components of the diffracted reimaged light occupying the position of the missing +2 diffraction order can be treated independently of one another. In particular, this diffracted reimaged light occupying the position of the missing +2 diffraction order is passed through Pockels cell 614 that phase shifts one of these two orthogonal components with respect to the other by an amount that corresponds with the value of a variable voltage (not shown) applied to Pockels cell 614, as known in the art.

Used in this fashion, Pockels cell 614 will not alter either orthogonal polarization, but, depending on the voltage impressed across the cell, will add a phase shift to one of the beams so that interference between the two beams can be adjusted to be maximum or minimum depending on whether their relative phases match or differ by 180°. Since the polarization of each of the two orthogonally polarized beams passing through Pockels cell 614 remains unchanged, any interference between them is limited to the components of the respective electric amplitude vectors thereof that have a common plane A common plane spatially oriented at 45° with respect to each of the orthogonal polarizations maximizes the resultant amplitude of these two components—i.e., ($\sin \theta + \cos \theta$) is a maximum when $\theta = 45°$. This fact permits the interference contrast to be increased in a number of different ways. One way is to pass the output from Pockels cell 614 through quarter-wave ($\lambda/4$) plate 616 oriented at 45° (the same orientation as $\lambda/2$ plate 606 in the projection system's pupil) followed by plane polarizer 618 with an arbitrary orientation. The orientation of plane polarizer 618 is not critical and can be used as a focus offset parameter. Another way is to employ a polaroid (not shown) oriented at 45° to the two orthogonal polarizations, rather than $\lambda/4$ plate 616 and plane polarizer 618. In either case, the light output from such a polaroid or plane polarizer 618, shown in FIG. 6, results in plane-polarized light having an intensity which varies as a sinusoidal function of the resultant of the value of the phase difference between the two orthogonal polarizations of the light prior to their being passed through Pockels cell 614 (i.e., a measure of the focus error) and the value of the phase shift introduced by Pockels cell 614 (determined by the value of the variable voltage applied to Pockels cell 614).

The intensity of the light output from plane polarizer 616 (or the polaroid) is sensed by detector 620 and the voltage applied to Pockels cell 614 is varied (e.g., by a saw-tooth signal) to determine at least one quantitative value thereof at which a maxima or minima occurs (i.e., the value of the phase shift required to produce that maxima or minima, which, in turn, depends on the amount of focus error).

Thus, a control signal indicative of the quantitative value of focus-error can be electro-optically generated in this alternative embodiment of the present invention without the need to mechanically move the wafer back and forth through best focus in order to determine control-signal parameter values for best-focus position (as is the case in the first-described embodiment). Instead, only after the control signal has been electro-optically generated and the quantitative value of the focus error ascertained, is this control signal then used by the stepper to directly control the movement of the wafer to the point of best focus.

While the preferred embodiments of the present invention employ first and second monochromatic illuminating light beams having the same wavelength to illuminate a single repetitive diffraction pattern with incident light at each of two different specified angles, this is not essential. All that is essential is that at least two separate beams of otherwise missing diffraction-order light be derived in which each of these separate derived beams comprises two interfering monochromatic-light components that have traveled over different paths. In this regard, reference is made to the known repetitive diffraction relationship P(sin $\phi$ + sin $\theta$)=n$\lambda$, where P is the grating period, $\phi$ is the angle of incidence of monochromatic light on the repetitive diffraction pattern, $\theta$ is the angle of diffraction of the nth diffraction order, n is the ordinal value of the diffraction order, and $\lambda$ is the wavelength of the monochromatic light. It is plain that so long as at least one of these parameters is different for each beam of otherwise missing diffraction-order light, the essential requirements of the present invention are met. Thus, alternatively, by way of each of two different examples, a single beam comprising two monochromatic illuminating light components having different wavelengths may be used to illuminate a single repetitive diffraction pattern with incident light at the same angle of incidence, or a single beam comprising a single monochromatic illuminating light of a given wavelength may be used to illuminate both of two separate diffraction-grating-pattern sets that have different periods with incident light at the same angle of incidence.

It may be also desirable to include reflective repetitive diffraction pattern 202 on a reticle 110 used to fabricate a subsequent layer pattern above first-layer pattern 200, so that the present invention can be used to focus such a layer pattern above the first-layer pattern on upper surface 100 of wafer 102. However, the fabrication of the first-layer pattern (which occurs after the above-described focusing of first-layer pattern 200 on the completely unpatterned reflective upper surface 100 of wafer 102) inherently results in the fabrication of a replica of repetitive diffraction pattern 202 on upper surface 100. In order to prevent the image of the repetitive diffraction pattern 202 on the reticle 110 that includes the above first-layer pattern from falling on top of the already present replica of repetitive diffraction pattern 202 on upper surface 100 of wafer 102, the position in the X-Y plane of wafer 102 during focusing may be changed by the microlithographic stepper to one different from the position during the exposure of upper surface 100 of wafer 102 to ultra-violet light used in the fabrication of a layer pattern on upper surface 100. This change in position of wafer 102 permits the image of the reticle repetitive diffraction pattern to always occupy a completely unpatterned reflective portion of the area of upper surface 100 during focusing.

For illustrative purposes, FIG. 4a is shown as including outgoing diffraction orders reflected from the grating pattern that extend from the $-3$ to the $+11$ diffraction orders and FIG. 4b is shown as including incoming diffraction orders to the wafer surface that only extend from the $-1$ to the $+9$ diffraction orders. However, it should be understood that, in practice, the respective number of outgoing and incoming diffraction orders may be different from those shown in FIGS. 4a and 4b. Further, because, in general, the principles of the present invention are based on the diffraction of radiation, the illuminating radiation employed in the practice of the present invention may be a wavelength longer than or shorter than visible light.

What is claimed is:

1. In a method for focusing a projection optical system on a reflective surface; said method comprising the steps of:
   (a) illuminating at least one repetitive diffraction pattern located in the object plane of said projection optical system with a beam of radiation including a given wavelength to derive thereby a plurality of different diffraction orders which are imaged by said projection optical system onto said reflective surface, said repetitive diffraction pattern having a certain configuration that is intended to result in substantially all energy to be missing from a particular one of said plurality of diffraction orders; and
   (b) employing said projection optical system to reimage the energy of each of at least two given ones of said imaged diffraction orders reflected from said reflective surface back onto said repetitive diffraction pattern in said object plane to derive thereby diffracted energy from each of said reimaged two given ones of said imaged diffraction orders located in the position normally occupied by said particular missing one of said plurality of diffraction orders;
   whereby interference between the diffracted radiation of said given wavelength of said reimaged two given ones of said imaged diffraction orders located in the position normally occupied by said particular missing one of said plurality of diffraction orders causes the radiation intensity thereof to vary sinusoidally in accordance with the amount of focus error of said projection optical system in focusing on said reflective surface, and a maxima or a minima in the radiation intensity of said reimaged two given ones of said imaged diffraction orders is indicative of the quantitative value of said focus error.

2. The method defined in claim 1, further including the step of:
   (c) varying the relative positions of said repetitive diffraction pattern and said reflective surface with respect to one another and in response to said variation in relative positions sensing the radiation intensity of said reimaged two given ones of said imaged diffraction orders;
   whereby a sensed maxima or a minima in said radiation intensity is indicative of a zero focus error.

3. The method defined in claim 1, wherein:
   step (a) comprises the steps of (c) illuminating said one repetitive diffraction pattern with a beam of plane-polarized radiation including said given wavelength; and (d) spatially rotating the plane of polarization of one of said two given ones of said imaged diffraction orders by substantially 90° with respect to the other to provide orthogonal planes of polarization thereof, thereby permitting them to be treated separately; and
   step (b) comprises the steps of (e) electro-optically phase shifting by a variable amount diffracted energy from one of said reimaged two given ones of said imaged orthogonally-polarized diffraction orders with respect to the other; and (f) converting said phase-shifted reimaged orthogonally-polarized diffraction orders to two diffraction orders that have a common plane of polarization, thereby permitting them to interfere with one another.

4. The method defined in claim 3, wherein:

step (e) comprises electro-optically phase shifting said diffracted energy from one of said reimaged two given ones of said imaged orthogonally-polarized diffraction orders with respect to the other in accordance with the value of an applied variable signal; and step (f) further includes sensing the radiation intensity of said interfering two diffraction orders that have a common plane of polarization in response to a change in the value of said applied variable signal;

whereby the value of said applied variable signal at which a maxima or a minima in said radiation intensity is sensed is indicative of the quantitative value of said focus error.

5. The method defined in claim 1, wherein:

step (f) comprises converting said phase-shifted reimaged orthogonally-polarized diffraction orders to two diffraction orders that have a common plane of polarization oriented at substantially 45° with respect to each of said phase-shifted reimaged orthogonally-polarized diffraction orders.

6. The focusing method defined in claim 1, wherein:

said repetitive diffraction pattern comprises at least one set of periodically-spaced elements having a certain configuration;

step (a) comprises simultaneously illuminating a set of said repetitive diffraction patterns with a plurality of n radiation beams having individually-assigned wavelengths $\lambda_1 \ldots \lambda_n$ and individually-assigned incident angles $\phi_1 \ldots \phi_n$, wherein the individually-assigned wavelength of each of said plurality of n radiation beams differs in value from one another, and/or the individually-assigned incident angle of each of said plurality of n radiation beams differs in value from one another, and/or, in the case in which said repetitive diffraction pattern comprises more than one set, the period of each of said periodically-spaced elements of each of said respective sets is different from one another; and step (b) comprises employing said projection optical system to reimage the radiation of each of at least two given ones of said imaged diffraction orders of each of said plurality of n radiation beams reflected from said reflective surface back onto said repetitive diffraction pattern to derive thereby diffracted radiation from each of said reimaged two given ones of said imaged diffraction orders said plurality of diffraction orders of each of said plurality of n said plurality of diffraction orders of each of said plurality of n radiation beams;

whereby a simultaneous maxima or a minima in the radiation intensity of each of said reimaged two given ones of said imaged diffraction orders is indicative of the quantitative value of said focus error.

7. In a focusing system for focusing a projection optical system on a reflective surface; said focusing system comprising:

first means for illuminating at least one repetitive diffraction pattern located in the object plane of said projection optical system with a radiation beam including a given wavelength to derive thereby a plurality of different diffraction orders which are imaged by said projection optical system onto said reflective surface, said repetitive diffraction pattern having a certain configuration that is intended to result in substantially all radiation to be missing from a particular one of said plurality of diffraction orders; and second means for employing said projection optical system to reimage the radiation of each of at least two given ones of said imaged diffraction orders reflected from said reflective surface back onto said repetitive diffraction pattern in said object plane to derive thereby diffracted radiation from each of said reimaged two given ones of said imaged diffraction orders located in the position normally occupied by said particular missing one of said plurality of diffraction orders;

whereby interference between the diffracted radiation of said given wavelength of said reimaged two given ones of said imaged diffraction orders located in the position normally occupied by said particular missing one of said plurality of diffraction orders causes the radiation intensity thereof to vary sinusoidally in accordance with the amount of focus error of said projection optical system in focusing on said reflective surface, and a maxima or a minima in the radiation intensity of said reimaged two given ones of said imaged diffraction orders is indicative of the quantitative value of said focus error.

8. The focusing system defined in claim 7, further comprising:

third means for varying the relative positions of said repetitive diffraction pattern and said reflective surface with respect to one another and in response to said variation in relative positions sensing the radiation intensity of said reimaged two given ones of said imaged diffraction orders;

whereby a sensed maxima or a minima in said radiation intensity is indicative of a zero focus error.

9. The focusing system defined in claim 7, wherein:

said first means comprises means for illuminating said one repetitive diffraction pattern with a beam of plane-polarized radiation including said given wavelength; and means for spatially rotating the plane of polarization of one of said two given ones of said imaged diffraction orders by substantially 90° with respect to the other to provide orthogonal planes of polarization thereof, thereby permitting them to be treated separately; and said second means comprises means for electro-optically phase shifting by a variable amount diffracted energy from one of said reimaged two given ones of said imaged orthogonally-polarized diffraction orders with respect to the other; and means for converting said phase-shifted reimaged orthogonally-polarized diffraction orders to two diffraction orders that have a common plane of polarization, thereby permitting them to interfere with one another.

10. The focusing system defined in claim 9, wherein:

means for converting said phase-shifted reimaged orthogonally-polarized diffraction orders to two diffraction orders that have a common plane of polarization convert said phase-shifted reimaged orthogonally-polarized diffraction orders to two diffraction orders that have a common plane of polarization oriented at substantially 45° with respect to each of of said phase-shifted reimaged orthogonally-polarized diffraction orders.

11. The focusing system defined in claim 9, wherein:

said spatially-rotating means includes a half-wave plate disposed in the path of only one of said two given ones of said imaged diffraction orders.

12. The focusing system defined in claim 9, wherein:
said means for electro-optically phase shifting includes means that electro-optically phase shifts said diffracted energy from one of said reimaged two given ones of said imaged orthogonally-polarized diffraction orders with respect to the other in accordance with the value of an applied variable signal; and
said focusing system further comprises detector means for sensing the radiation intensity of said interfering two diffraction orders that have a common plane of polarization;
whereby the value of said applied variable signal at which a maxima or a minima in said radiation intensity is sensed is indicative of the quantitative value of said focus error.

13. The focusing system defined in claim 12, wherein:
said means that electro-optically phase shifts said diffracted energy in accordance with the value of an applied variable signal comprises a Pockels cell.

14. The focusing system defined in claim 12, wherein:
said converting means comprises a quarter-wave plate and a plane polarizer.

15. The focusing system defined in claim 7, wherein:
said repetitive diffraction pattern comprises at least one set of periodically-spaced elements having a certain configuration;
said first means comprises third means for simultaneously illuminating a set of said repetitive diffraction pattern with a plurality of n radiation beams having individually-assigned wavelengths $\lambda_1 \ldots \lambda_n$ and individually-assigned incident angles $\phi_1 \ldots \phi_n$, wherein the individually-assigned wavelength of each of said plurality of n radiation beams differs in value from one another, and/or the individually-assigned incident angle of each of said plurality of n radiation beams differs in value from one another, and/or, in the case in which said repetitive diffraction pattern comprises more than one set, the period of each of said periodically-spaced elements of each of said respective sets is different from one another; and
said second means comprises fourth means employing said projection optical system to reimage the radiation of each of at least two given ones of said imaged diffraction orders of each of said plurality of n radiation beams reflected from said reflective surface back onto said repetitive diffraction pattern to derive thereby diffracted radiation from each of said reimaged two given ones of said imaged diffraction orders located in the position normally occupied by said particular missing one of said plurality of diffraction orders of each of said plurality of n radiation beams;
whereby a simultaneous maxima or a minima in the radiation intensity of each of said reimaged two given ones of said imaged diffraction orders is indicative of the quantitative value of said focus error.

16. The focusing system defined in claim 7 for use with a microlithographic stepper that includes said projection optical system and a wafer-supporting movable stepper stage in the vicinity of the focus of said projection optical system for moving a wafer through said focus; wherein:
said reflective surface comprises the surface of said wafer; and
said repetitive diffraction pattern is included in a given reticle pattern disposed on a reticle situated substantially in said object plane of said projection optical system.

17. The focusing system defined in claim 16, wherein:
said given reticle pattern comprises a reflective pattern on said reticle.

18. The focusing system defined in claim 16, wherein:
said radiation is light radiation.

19. The focusing system defined in claim 16, wherein:
said microlithographic stepper is a Half-Field Dyson microlithographic stepper.

20. The focusing system defined in claim 16, further comprising:
detector means, including an intensity detector positioned to detect the intensity of said radiation of said imaged diffraction orders that are located in the position normally occupied by said particular missing one of said plurality of diffraction orders, for deriving an output used to control the positioning of said movable stepper stage in response to said intensity of said radiation reaching a maxima or a minima.

21. The focusing system defined in claim 16, wherein:
said repetitive diffraction pattern comprises at least one set of periodically-spaced elements having a certain configuration;
said first means comprises third means for simultaneously illuminating a set of said repetitive diffraction pattern with a plurality of n radiation beams having individually-assigned wavelengths $\lambda_1 \ldots \lambda_n$ and individually-assigned incident angles $\phi_1 \ldots \phi_n$, wherein the individually-assigned wavelength of each of said plurality of n radiation beams differs in value from one another, and/or the individually-assigned incident angle of each of said plurality of n radiation beams differs in value from one another, and/or, in the case in which said repetitive diffraction pattern comprises more than one set, the period of each of said periodically-spaced elements of each of said respective sets is different from one another; and
said second means comprises fourth means employing said projection optical system to reimage the radiation of each of at least two given ones of said imaged diffraction orders of each of said plurality of n radiation beams reflected from said reflective surface back onto said repetitive diffraction pattern to derive thereby diffracted radiation from each of said reimaged two given ones of said imaged diffraction orders located in the position normally occupied by said particular missing one of said plurality of diffraction orders of each of said plurality of n radiation beams;
whereby a simultaneous maxima or a minima in the radiation intensity of each of said reimaged two given ones of said imaged diffraction orders is indicative of the quantitative value of said focus error.

22. The focusing system defined in claim 21, wherein: the value of n is 2.

23. The focusing system defined in claim 21, further comprising:
detector means, including a separate-intensity detector positioned to detect the intensity of said radiation of said imaged diffraction orders that are located in the position normally occupied by said particular missing one of said plurality of diffraction orders of each of said plurality of n radiation beams, for deriving an output used to control the positioning of said movable stepper stage in response to said intensity of said radiation detected by all of said separate-intensity detectors substantially simultaneously reaching a maxima or a minima.

24. The focusing system defined in claim 7, wherein: said repetitive diffraction pattern comprises at least one set of periodically-spaced elements having a certain configuration.

25. The focusing system defined in claim 24, wherein: said one set of periodically-spaced reflective elements have a certain configuration that comprises a linear grating consisting of a single group of equidistant substantially parallel elements, in which the width of each element of said single group of said linear grating is substantially a and the period of said single group of said linear grating is substantially P, and the ratio P/a is substantially a given integer m having a value of at least 2.

26. The focusing system defined in claim 25, wherein m=2.

27. The focusing system defined in claim 24, wherein: said one set of periodically-spaced elements have a certain configuration that comprises first and second separated groups of equidistant substantially parallel linear elements, in which the period of each of said first and second separated groups of said certain configuration is substantially P and the separation between said first and second separated groups of said certain configuration is substantially d, and $$d = \frac{m + 1/2}{n} \cdot P,$$

where m is a given integer and n is the ordinal value of the particular diffraction order that is missing.

28. The focusing system defined in claim 27, wherein: where m=0 and n=2, whereby d=P/4.

29. The focusing system defined in claim 24, wherein: said one set of periodically-spaced reflective elements have a certain two-dimensional configuration that comprises substantially square elements arranged in a checkerboard pattern, in which the size of each side of each square element of said certain two-dimensional configuration is substantially a and the period of said certain two-dimensional configuration in each of its two dimensions is substantially P, and the ratio P/a is substantially a given integer m having a value of at least 2.

30. The focusing system defined in claim 29, wherein m=2.

31. In a reticle including a reticle pattern disposed thereon, said reticle, in use, being situated in the object plane of microlithographic-stepper projection optical system which images said reticle pattern on a reflective surface of a wafer; the improvement in said reticle comprising:

a repetitive diffraction pattern incorporated in said reticle pattern, said repetitive diffraction pattern comprising at least one set of periodically-spaced reflective elements having a certain configuration, wherein said configuration of said periodically-spaced reflective elements of each set is such that illumination of said repetitive diffraction pattern results in both the positive and negative of a particular ordinal diffraction order of each set thereof being substantially missing, and, in the case in which said repetitive diffraction pattern comprises more than one set, the value of said period is different for each of said sets;

whereby said repetitive diffraction pattern can be used to focus the image of said reticle pattern substantially in the image plane of said projection optical system.

32. The reticle defined in claim 31, wherein: said one set of periodically-spaced reflective elements have a certain configuration that comprises a linear grating consisting of a single group of equidistant substantially parallel elements, in which the width of each element of said single group of said linear grating is substantially a and the period of said single group of said linear grating is substantially P, and the ratio P/a is substantially a given integer m having a value of at least 2.

33. The reticle defined in claim 32, wherein m=2.

34. The reticle defined in claim 31, wherein: said one set of periodically-spaced elements have a certain configuration that comprises first and second separated groups of equidistant substantially parallel linear elements, in which the period of each of said first and second separated groups of said substantially in the image plane of said projection optical system certain configuration is substantially P and the separation between said first and second separated groups of said certain configuration is substantially d, and $$d = \frac{m + 1/2}{n} \cdot P,$$

where m is a given integer and n is the ordinal value of the particular diffraction order that is missing.

35. The reticle defined in claim 34, wherein: where m=0 and n=2, whereby d=P/4.

36. The reticle defined in claim 31, wherein: said one set of periodically-spaced reflective elements have a certain two-dimensional configuration that comprises substantially square elements arranged in a checkerboard pattern, in which the size of each side of each square element of said certain two-dimensional configuration is substantially a and the period of said certain two-dimensional configuration in each of its two dimensions is substantially P, and the ratio P/a is substantially a given integer m having a value of at least 2.

37. The reticle defined in claim 36, wherein m=2.

38. The reticle defined in claim 31, wherein: said reticle pattern disposed on said reticle incorporates a first-layer pattern disposed thereon in predetermined spaced relationship with respect to said repetitive diffraction pattern incorporated in said reticle pattern such that the subsequent patterning of the surface of said wafer with an in-focus image of said reticle pattern results in said repetitive diffraction pattern being coincident with a scribe line on said wafer.

39. The reticle defined in claim 31, wherein: said reticle pattern is a reflective reticle pattern.

40. The reticle defined in claim 31, wherein: said reticle, in use, is situated in the object plane of the projection optical system of a Half-Field Dyson microlithographic stepper.

* * * * *